United States Patent
Chen et al.

(10) Patent No.: US 8,203,862 B2
(45) Date of Patent: Jun. 19, 2012

(54) VOLTAGE REFERENCE GENERATION WITH SELECTABLE DUMMY REGIONS

(75) Inventors: Yiran Chen, Eden Prairie, MN (US); Hai Li, Eden Prairie, MN (US); Wenzhong Zhu, Apple Valley, MN (US); Xiaobin Wang, Chanhassen, MN (US); Yuan Yan, Edina, MN (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 417 days.

(21) Appl. No.: 12/502,191

(22) Filed: Jul. 13, 2009

(65) Prior Publication Data

US 2010/0091550 A1 Apr. 15, 2010

Related U.S. Application Data

(60) Provisional application No. 61/104,390, filed on Oct. 10, 2008.

(51) Int. Cl.
*G11C 11/00* (2006.01)

(52) U.S. Cl. .............. 365/148; 365/171; 365/189.09; 365/210.1; 365/230.02

(58) Field of Classification Search .............. 365/148, 365/171, 210.1, 189.09, 230.02
See application file for complete search history.

(56) References Cited

U.S. PATENT DOCUMENTS

| | | | |
|---|---|---|---|
| 6,141,258 A * | 10/2000 | Kawasumi | 365/189.05 |
| 6,314,014 B1 | 11/2001 | Lowrey et al. | |
| 6,504,752 B2 * | 1/2003 | Ito | 365/158 |
| 6,563,743 B2 * | 5/2003 | Hanzawa et al. | 365/189.02 |
| 6,847,561 B2 | 1/2005 | Hashimoto et al. | |
| 7,489,577 B2 * | 2/2009 | Sato et al. | 365/210.1 |
| 7,646,627 B2 * | 1/2010 | Hidaka | 365/158 |
| 7,864,564 B2 * | 1/2011 | Hidaka | 365/158 |
| 7,881,094 B2 * | 2/2011 | Chen et al. | 365/148 |

* cited by examiner

*Primary Examiner* — Pho M Luu
(74) *Attorney, Agent, or Firm* — Hall Estill Attorneys at Law

(57) ABSTRACT

An apparatus and associated method for generating a reference voltage with dummy resistive sense element regions. A first resistance distribution is obtained for a first dummy region of resistance sense elements and a second resistance distribution is obtained for a second dummy region of resistive sense elements. A user resistive sense element from a user region is assigned to a selected resistive sense element of one of the first or second dummy regions in relation to the first and second resistance distributions.

18 Claims, 5 Drawing Sheets

VOLTAGE REFERENCE GENERATION WITH SELECTABLE DUMMY REGIONS

RELATED APPLICATIONS

This application makes a claim of domestic priority under 35 U.S.C. §119(e) to U.S. Provisional Patent Application No. 61/104,390 filed Oct. 10, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power. Non-volatile memory cells can take a variety of constructions, such as spin-torque transfer random access memory (STTRAM or STRAM), resistive random access memory (RRAM), magnetic random access memory (MRAM), etc.

In these and other types of data storage devices, the cells can be configured to have different electrical resistances to store different logical states. The resistance state of a particular cell can be detected during a read operation by applying a read current, sensing a voltage drop across the cell, and comparing the sensed voltage drop with a reference voltage.

SUMMARY

Various embodiments of the present invention are generally directed to an apparatus and associated method for generating a reference voltage with dummy resistive sense element regions.

In accordance with some embodiments, a first resistance distribution is obtained for a first dummy region of resistance sense elements and a second resistance distribution is obtained for a second dummy region of resistive sense elements. A user resistive sense element from a user region is assigned to a selected resistive sense element of one of the first or second dummy regions in relation to the first and second resistance distributions.

These and various other features and advantages which characterize the various embodiments of the present invention can be understood in view of the following detailed discussion and the accompanying drawings.

DETAILED DESCRIPTION

Figure 1:
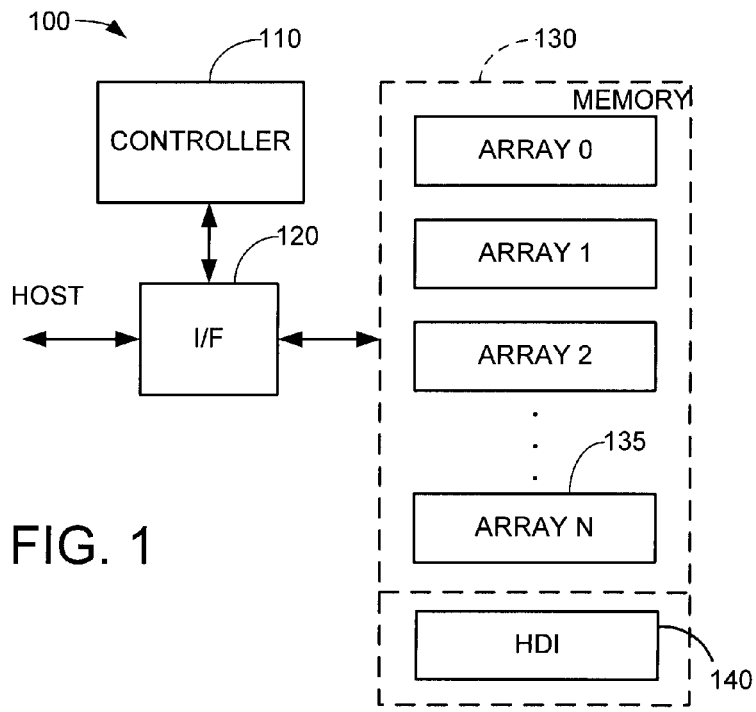
FIG. 1 is a functional representation of an exemplary data storage device constructed and operated in accordance with various embodiments of the present invention.

FIG. 1 provides a functional block representation of an electrical device 100 to provide an exemplary environment in which various embodiments of the present invention can be practiced. The device 100 is characterized as a data storage device such as a solid-state drive (SSD), although such is not limiting.

Top level control of the device 100 is carried out by a suitable controller 110, which may be a programmable or hardware based microcontroller. The controller 110 communicates with a host device via a device interface (I/F) circuit 120. A memory space is shown at 130 to comprise a number of memory arrays 135 (denoted Array 0-N), although it will be appreciated that a single array can be utilized as desired. Each array 135 comprises a block of semiconductor memory of selected storage capacity. A hard disk interface (HDI) 150 can be included to allow a magnetic data storage device to be implemented. The hard disk interface 150 can be accessed by the interface 120 either individually or in combination with other data storage memory arrays 135.

Figure 2:
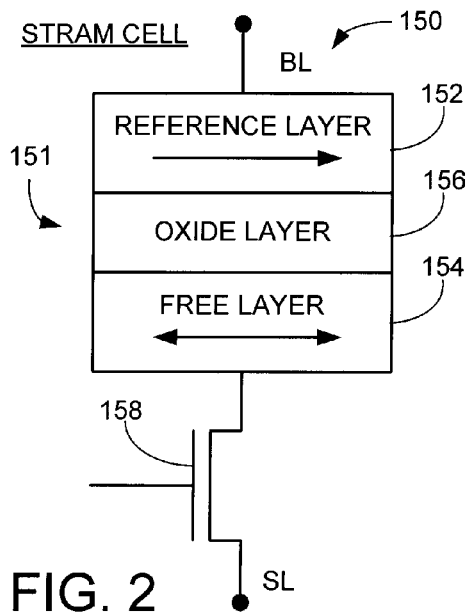
FIG. 2 shows an exemplary construction for a spin-torque transfer random access memory (STTRAM or STRAM) cell.

FIG. 2 shows an exemplary memory cell construction for a selected memory array of FIG. 1. The memory cell in FIG. 2 is characterized as an STRAM cell 150 with a resistive sense element (RSE) comprising a magnetic tunneling junction (MTJ) 151. The MTJ 151 is formed from two ferromagnetic layers 152, 154 separated by an oxide barrier layer 156 (such as magnesium oxide, MgO). The resistance of the MTJ 151 is determined in relation to the relative magnetization directions of the ferromagnetic layers 152, 154: when the magnetization is in the same direction, the MTJ is in the low resistance state ($R_L$); when the magnetization is in opposite directions, the MTJ is in the high resistance state ($R_H$).

In some embodiments, the magnetization direction of the reference layer 152 is fixed by coupling to a pinned magnetization layer (e.g., a permanent magnet, etc.), and the magnetization direction of the free layer 154 can be changed by passing a driving current polarized by magnetization in the reference layer 152.

To read the logic state stored by the MTJ 151, a relatively small current can be passed through the MTJ between a source line (SL) and a bit line (BL). Because of the difference between the low and high resistances of the MTJ 151 in the respective logical 0 and 1 states, the voltage at the bit line will be different. The memory state of the cell can be sensed using a suitable sense amplifier which compares the sensed bit line voltage to a suitable reference voltage. A switching device 158 allows selective access to the MTJ 151 during read and write operations.

Figure 3:
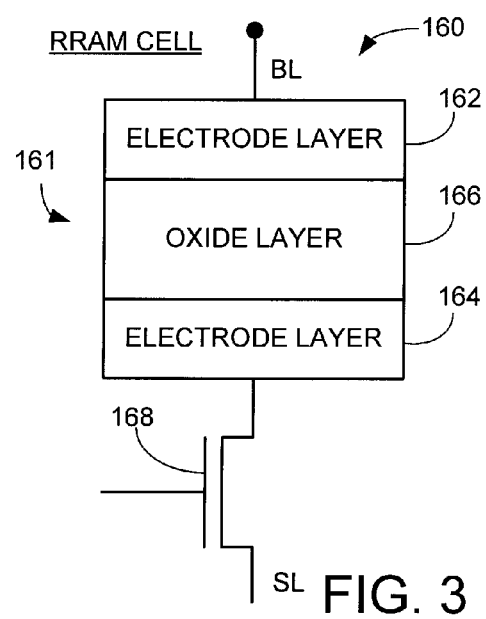
FIG. 3 shows an exemplary construction for a resistive random access memory (RRAM) cell.

FIG. 3 illustrates an RRAM cell 160 as an alternative memory cell construction. The RRAM cell 160 provides a filament-based RSE 161 with opposing electrode layers 162, 164 and an oxide layer 166. The oxide layer 166 may be configured to normally have a nominally high resistance (e.g., $R_H$). The resistance of the oxide layer is lowered (e.g., $R_L$) through application of a relatively high write voltage across the RRAM cell 160, which generates one or more conductive metallization paths (filaments) as components of a selected electrode layer 162, 164 migrate into the oxide layer 166.

The oxide layer 166 can be restored to its original higher resistance state through application of a corresponding voltage of opposite polarity. As with the STRAM cell 150 of FIG. 2, the storage state of the RRAM cell 160 of FIG. 3 can be read by passing a read current from a source line (SL) to a bit line (BL), and comparing the bit line voltage to a suitable reference voltage. As before, a switching device 168 facilitates access to the RRAM cell.

Various embodiments of the present invention are generally directed to selecting appropriate reference voltages during read operations upon a memory cell, such as but not limited to memory cell constructions as set forth in FIGS. 2-3. As explained below, this can involve obtaining a first resistance distribution for a first dummy region of RSEs and a second resistance distribution for a second dummy region of RSES. A user RSE from a user region is assigned to a selected RSE of one of the first or second dummy regions in relation to the first and second resistance distributions.

Figure 4:
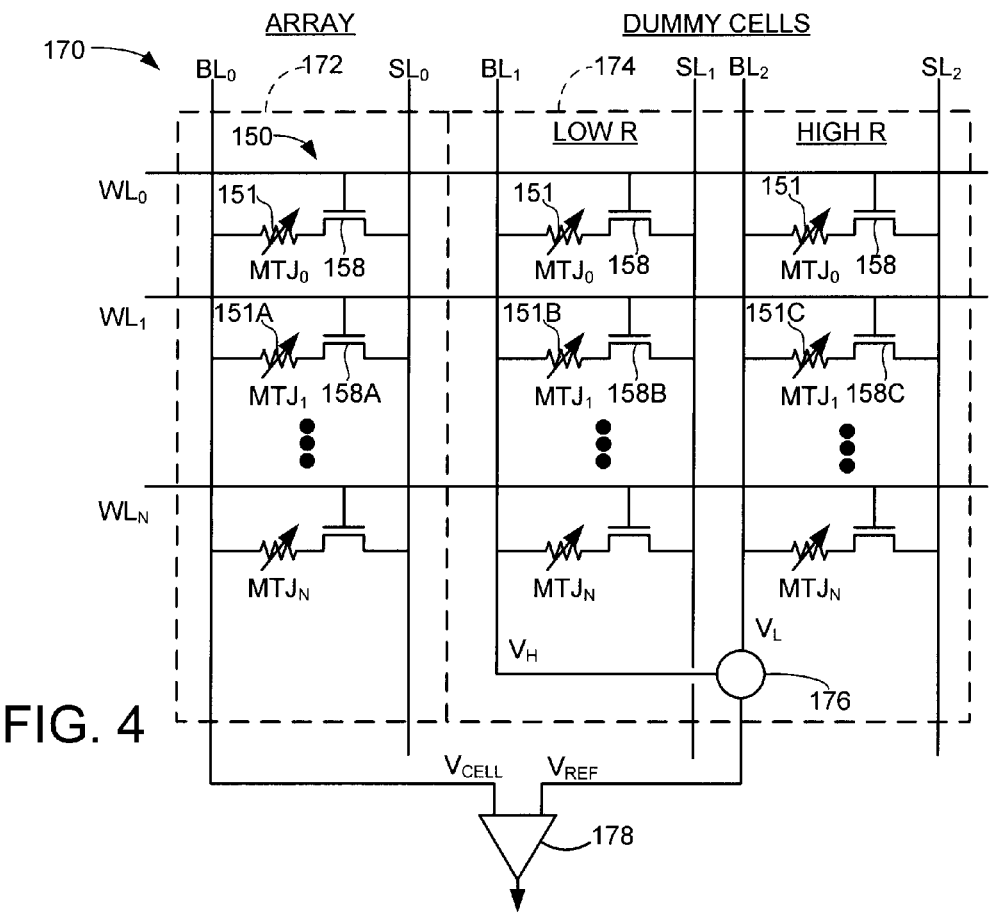
FIG. 4 provides a schematic representation of the use of dummy cells to generate a reference voltage.

FIG. 4 shows an exemplary memory circuit 170 formed of STRAM cells 150 as set forth in FIG. 2. The memory circuit 170 includes an array portion 172 and a dummy cell portion 174. While only a single column of STRAM cells 150 is shown in the array 172 in FIG. 4, the array can be alternatively configured to have a larger number of adjacent columns of cells which can be alternatively selected as desired. The column of STRAM cells 150 in the array 172 constitutes a total number of N cells+1 with MTJs denoted $MTJ_0$ to $MTJ_N$.

The dummy cell portion 174 includes two columns of STRAM cells 150, each also having a total number of N+1 dummy cells. The dummy cells are used to generate suitable reference voltage values during a read operation upon the memory cells in the array 172. The MTJs in the first column ("LOW R") of the dummy cell portion 184 are each programmed to the low resistance (RL) state, and the MTJs in the second column ("HIGH R") of the dummy cell portion 184 are each programmed to the high resistance (RH) state.

A number of control lines provide access to the respective cells in the array 172 and the dummy cell portion 174. These control lines include word lines WL0, WL1, . . . WLN; bit lines BL0, BL1 and BL2; and source lines SL0, SL1 and SL2. The word lines extend across the memory circuit 170 to place selected memory array cells and dummy reference cells into individually selectable rows.

An exemplary read operation upon a selected STRAM cell 150 in the array 172 will now be described. For this discussion, it will be contemplated that this read operation will determine the resistive state of $MTJ_1$ in the array 172. The reading of the remaining MTJs in the array 172 are carried out in a similar fashion. For reference, the $MTJ_1$ cell in the array 172 is numerically denoted herein as 151A. The corresponding $MTJ_1$ cells in the dummy reference portion 174 are correspondingly denoted herein as 151B and 151C.

Suitable control circuitry operates to place a suitable read voltage on bit line BL0, and connects source line SL0 to a suitable level, such as ground. Similar configurations are made for the bit lines BL1, BL2 and source lines SL1 and SL2 of the dummy reference portion 174. The word line WL1 is next asserted, allowing respective read currents to be respectively passed through the MTJs 151A-C.

The output of the memory cell provides a voltage $V_{CELL}$ indicative of the voltage drop across the $MTJ_1$ 151A in the array 172. The voltage $V_{CELL}$ will vary in relation to the programmed resistive state of the MTJ (i.e., logical 0 or 1). The dummy reference array will output a high voltage $V_H$ in relation to the programmed state of $MTJ_1$ 151B and a low voltage $V_L$ in relation to the $MTJ_1$ 151C programmed state. The respective voltages $V_H$ and $V_L$ are combined at summing junction 176 to provide a reference voltage $V_{REF}$, as follows:

$$V_{REF} = \frac{(V_H + V_L)}{2} \tag{1}$$

The $V_{CELL}$ voltage is compared to the $V_{REF}$ voltage by a sense amplifier 178 to output a data bit value corresponding to the logical state of the MTJ1 151A. Ideally, the $V_{REF}$ value will be a suitable value between the $V_H$ and $V_L$ levels (also referred to as the "$V_{MAX}$" and "$V_{MIN}$" values) so that accurate determinations of the storage states of the memory cells can be made.

While the use of dummy cells to generate reference voltages as in FIG. 4 has been found operable, a limitation with these and other reference voltage generation approaches relates to variations that can arise in the respective resistances of the memory cells. Such variations can arise due to a number of factors, including variability as a result of manufacturing processing during device fabrication. The $V_{CELL}$ voltage output on the bit line BL0 in FIG. 4 can be generally expressed as:

$$V_{CELL} = I_R(R_{CELL} + R_{TR}) \tag{2}$$

where $I_R$ is the read current, $R_{CELL}$ is the resistance of the associated MTJ 151, and $R_{TR}$ is the resistance of the associated switching device (transistor) 158. $R_{TR}$ is the forward biased drain-source resistance of the transistor, and will usually be a relatively low value (e.g., on the order of a few hundred ohms Ω or less, depending on the size of the transistor.). As noted above, the $R_{CELL}$ value may be low ($R_L$ or "$R_{MIN}$") or high ($R_H$ or "$R_{MAX}$") depending on the programmed state of the cell, and these respective values can vary significantly. It will be noted from equation (2) that variations in the magnitude of read current $I_R$ can also contribute to variations in the sensed cell voltage $V_{CELL}$.

These variation effects can be present not only for memory cells being read (such as the $MTJ_1$ 151A in FIG. 4), but also for dummy cells used to generate the reference voltage $V_{REF}$ (such as dummy cells $MTJ_1$ 151B and 151C in FIG. 4) during the read operation. Depending on the respective variation distributions, a generated $V_{REF}$ may be greater than the $V_{MAX}$ value or less than the $V_{MIN}$ value for a given memory cell, preventing accurate determination of the storage state of the cell being read.

Figure 5:
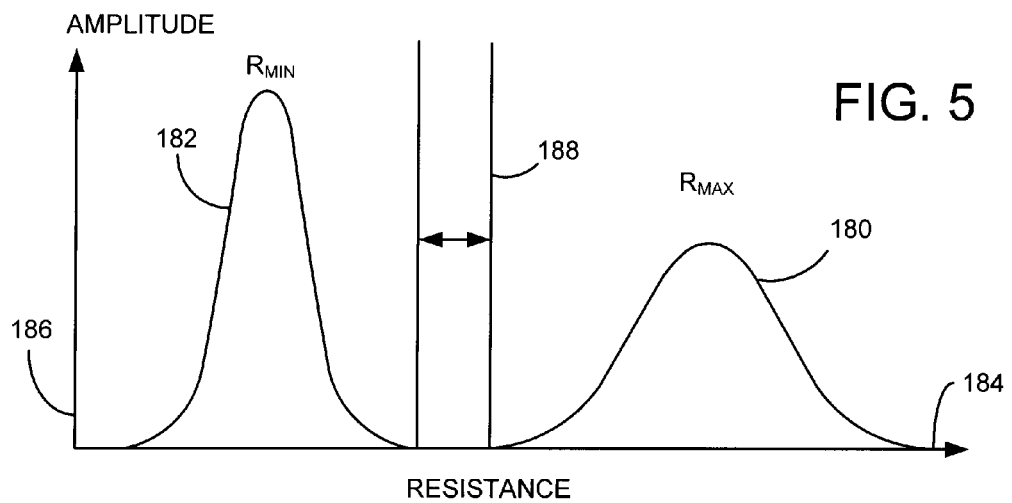
FIG. 5 displays resistance characteristics for the circuitry of FIG. 4.

FIG. 5 provides a graphical representation of exemplary cell resistance variation curves 180 and 182, plotted against a resistance x-axis 184 and an amplitude y-axis 186. The curves 180 and 182 represent distributions of $R_{MIN}$ and $R_{MAX}$ values for a population of RSM cells, such as the STRAM cells 150 in FIG. 4. Initially, it would appear that sufficient margin exists between the respective population curves 180, 182 to ensure proper voltage reference VREF generation. However, range 188 illustrates the window of resistance values that can result in indeterminate logical states without a definite resistance state that falls within either the $R_{MIN}$ and $R_{MAX}$ distributions.

Therefore, the use of dummy cells to coordinate a range of resistance values specifically for a memory cell advantageously reduces the probability that the memory cell will fall in the indeterminate range 188. Furthermore, the ability to evaluate and assign groups or individual data RSE to dummy cells that provide the best probability of error-free operation allows higher memory device yield and reliability. In addition, having several redundant dummy cell regions provide a higher probability that a data RSE can be assigned to a dummy cell that has substantially similar resistance distribution. As such, the evaluation and assigning of data RSE to dummy cells presents advantageous memory device operation that improves reliability and performance.

Figure 6:
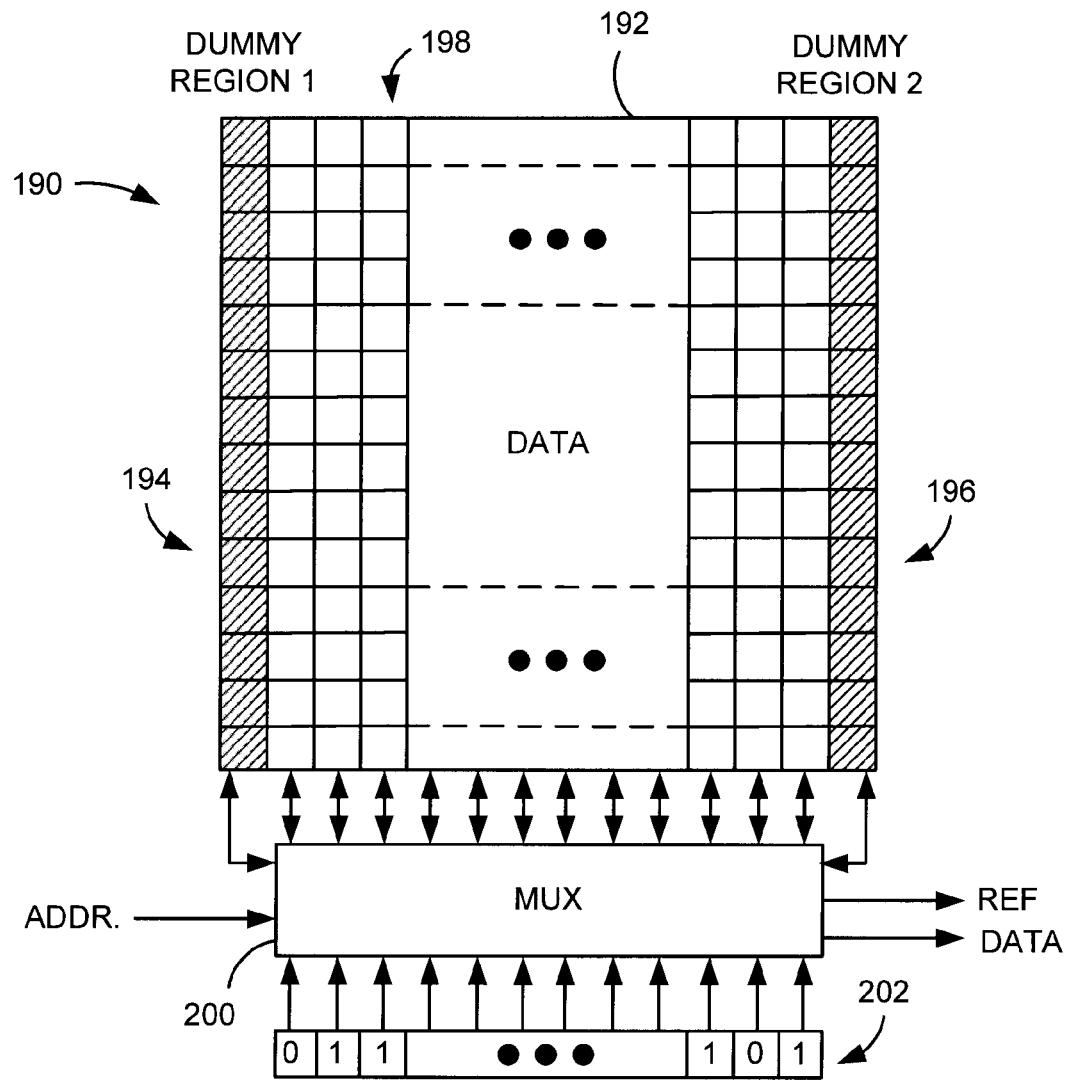
FIG. 6 generally features a selective dummy region circuitry constructed in accordance with various embodiments of the present invention.

In FIG. 6, an exemplary selective dummy region circuitry 190 is displayed in accordance with various embodiments of the present invention. The circuitry 190 has a memory space 192 in which a first dummy region 194 and second dummy region 196 dispose a user region 198. In some embodiments, the various regions of the memory space 192 are composed of multiple RSE. However, the regions are not limited to have the same number of RSE.

In contrast to the reference generation displayed in FIG. 4, each dummy region 194 and 196 can produce both high and low reference values. That is, the dummy regions of FIG. 6 can be constructed with both a high resistance RSE and low resistance RSE, as displayed in FIG. 4, to generate a reference value.

Further with the circuitry 190 of FIG. 6, a memory space controller, such as the displayed programmable multiplexer 200 engages the memory space 192 to facilitate essential memory functions. The multiplexer 200 can have a large number of inputs and outputs to enable timely memory space operation. As shown, the multiplexer 200 of FIG. 6 receives data from a buffer 202 and an address of the logical position to store the buffered data. The multiplexer 200 can also output data and reference values from the memory space 192 either individually or simultaneously with the inputting of buffered data.

In some embodiments, the logical position of the dummy regions 194 and 196 are on ultimate opposing ends of the memory space, as shown in FIG. 6. The separation of the dummy regions 194 and 196 minimizes the spacious correlation of the resistance distributions to provide increased reliability of the memory space 192. However, the logical position of the dummy regions 194 and 196 can be placed anywhere including, but not limited to, external memory spaces and adjacent to one another.

Further in some embodiments, the dummy regions 194 and 196 are evaluated by resistance characteristics and assigned to a particular one, or many, user RSE of the user region 198. The assignment of user RSE to dummy region RSE provides a structured correlation where the dummy RSE will supply the resistance values necessary to accurately assess the logical state of the user RSE. The logical addresses of the assigned dummy RSE and user RSE are stored in non-volatile memory such as, but not limited to, spin torque transfer random access memory (STRAM) or resistive random access memory (RRAM).

Alternatively, the non-volatile memory can store the logical address of the user RSE and the selected dummy region 194 or 196. The fact that each dummy region has the same number of RSE as a column of user RSE allows the dummy RSE of the same row as the user RSE to be accessed without storing the exact assigned logical address.

The assignment of user RSE to dummy RSE can occur during manufacture by an evaluation scheme, such as a built-in self-tester (BIST). However, one, or many, of the RSE in a dummy region can have an abnormal resistance characteristic for various reasons that bring the dummy RSE out of compliance with acceptable tolerances. In those situations, a redundant dummy region provides an increased probability that the user RSE can be assigned to a dummy RSE that meets specified tolerances. Hence, the BIST evaluates the user RSE and finds the best dummy RSE to provide the most reliable operation.

It should be noted that the "best" dummy RSE is not limited to a certain criteria and can be various different factors including, but not limited to, the best resistance distribution for a given user RSE or merely the dummy RSE that meets specified resistance tolerances. Additionally, the assignment of user RSE to dummy RSE can be performed at various times, or multiple times, during the operational life of the memory space 192. For example, an assignment can be made during the manufacture of the memory space circuitry 190 and a subsequent reassignment after a predetermined condition or passage of time.

Figure 7:
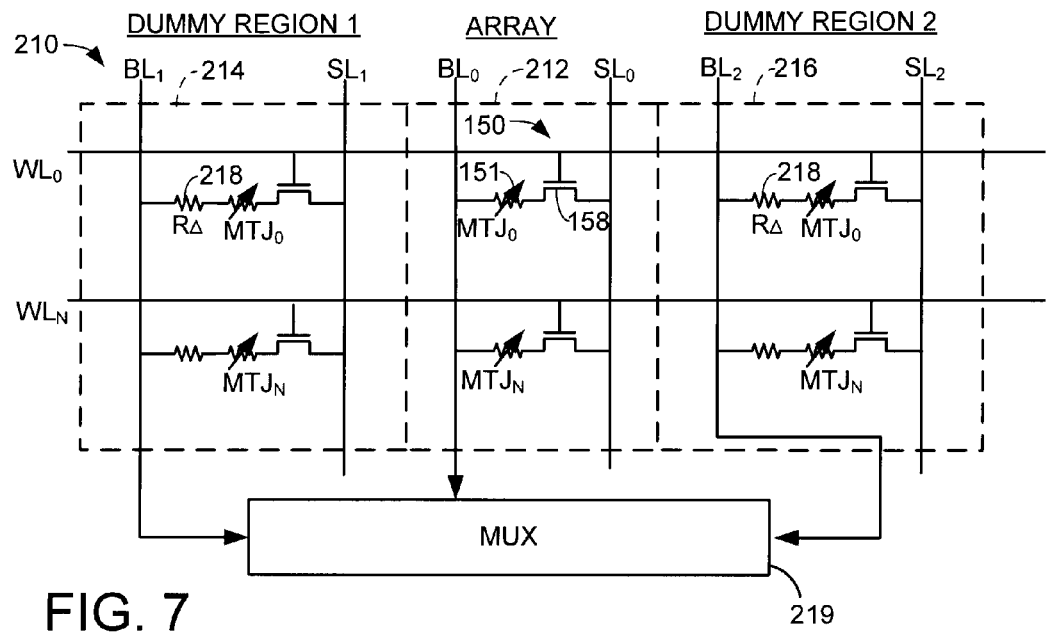
FIGS. 7 and 8 shows schematic representations of the selective dummy region circuitry of FIG. 6 configured in accordance with various embodiments of the present invention.
Figure 8:
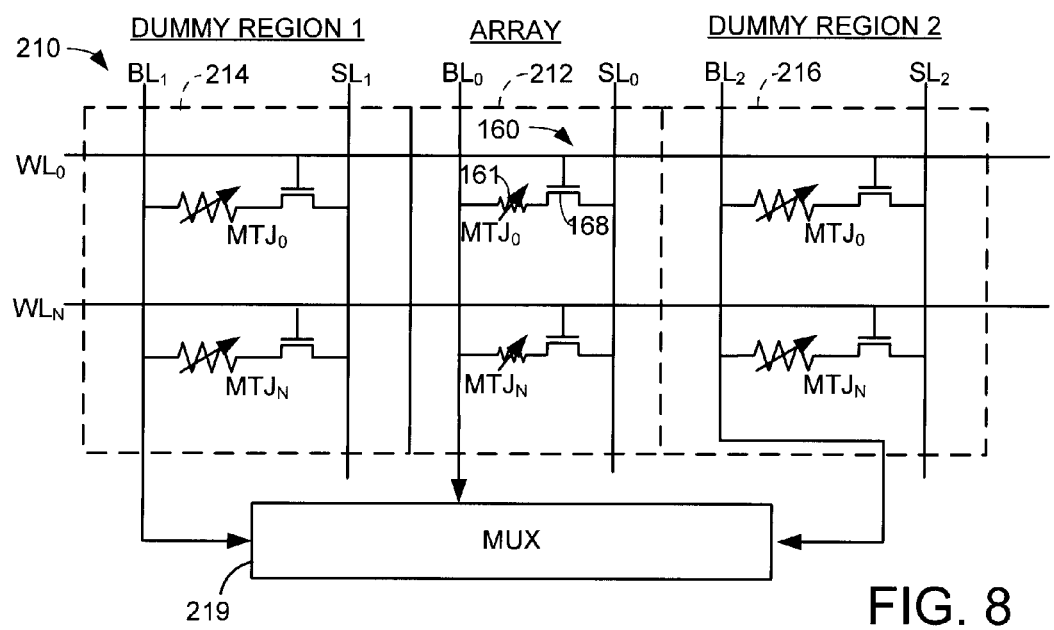

FIGS. 7 and 8 illustrate a schematic representation of a selective dummy region circuitry 210 in accordance with the various embodiments of the present invention. The circuitry 210 features a user array 212 that comprises a column of RSM cells (in this case, STRAM cells 150) with MTJs from $MTJ_0$ to $MTJ_N$. The user array 212 is between first and second dummy regions 214 and 216 each having N+1 dummy cells. The user memory cells have a switching device 158 as well as an RSE 151. It should be noted that magnetic tunneling junctions (MTJ) are shown, but the user memory cell is not limited to magnetic memory technology.

To read a selected MTJ in the array 212, respective read currents are applied to the bit lines $BL_0$ and $BL_1$. The source lines $SL_0$ and $SL_1$ are set to reference (e.g., ground), and the word line $WL_1$ is asserted. This induces a voltage $V_{CELL}$ on the bit line $BL_0$ in relation to the programmed resistance of $MTJ_1$, and induces a reference voltage $V_{REF}$ on the bit line $BL_1$.

The cells of the dummy regions 214 and 216 each have a differential resistance ($R_A$) illustrated by the resistor 218. The $R_A$ can be various resistance values of numerous origins, but the function of the $R_A$ is to compensate for additional resistance in the cell, such as from the switching device. In some embodiments, the $R_A$ compensates for a write current bias while other embodiments an asymmetrical write direction is compensated.

The structure of the circuitry 210 clearly shows a columnar orientation between the regions in which any particular user memory cell has redundant dummy cells with independent bit lines and source lines but connected by a common word line. The ability to control the switching devices of both the dummy cell and the user memory cell allows simple and reliable data storage and access.

While the bit lines of the circuitry 210 are connected to a multiplexer 219, the structure is not limiting as the source lines can be connected to the multiplexer either singularly, or in combination with the bit lines.

Meanwhile, FIG. 8 shows the circuitry 210 without a $R_A$ compensation in any of the cells, either dummy or user. While the circuitry 210 is shown either with or without $R_A$ compensation, it can be appreciated that the resistor can be programmed into a single cell or multiple cells depending upon need.

Figure 9:
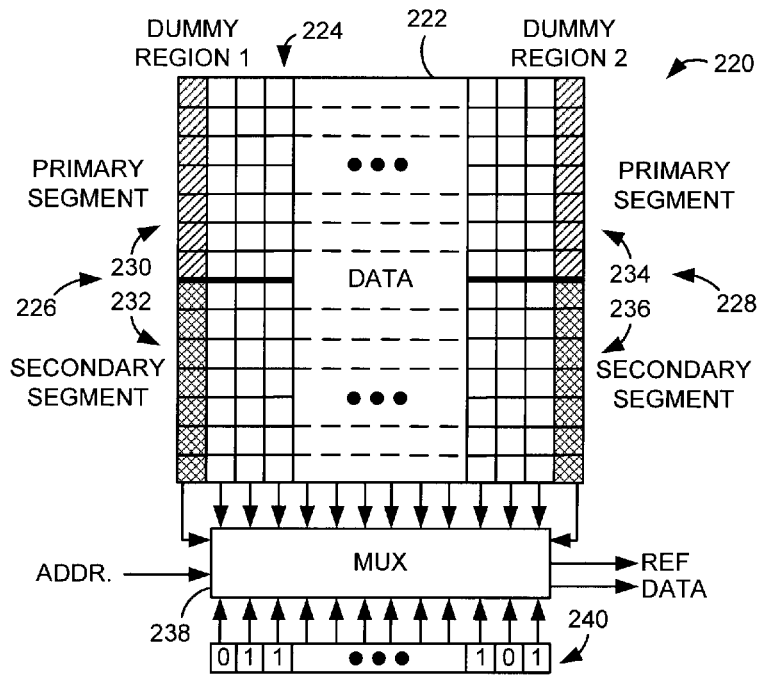
FIG. 9 provides a selective dummy region circuitry constructed in accordance with various embodiments of the present invention.

FIG. 9 displays an alternative selective dummy region circuitry 220 constructed in accordance with various embodiments of the present invention. The circuitry 220 has a memory space 222 containing a user region 224 of user RSE that is disposed between a first and second dummy region 226 and 228. However, each dummy region is divided into a primary segment 230 (234) and a secondary segment 232 (236). Statistically, the more dummy RSE included in a dummy region, the error rate from using different dummy regions increases. To reduce this effect, the dummy regions can be split into the primary and secondary segments virtually. Thus, the assignment of a user RSE to the best dummy RSE and the storage of the logical address of the corresponding RSE does not change, but the resistance distributions from the segmented dummy regions provide a more reliable indication of the best match for a particular user RSE.

It should be noted that it is not necessary that every user RSE needs one dummy RSE. A single dummy RSE can be shared by multiple user RSE or any size of memory block, as shown in FIG. 9. Likewise, the segmented dummy regions does not affect the generation of a reference value or the input/output of data through a multiplexer 238 and a buffer 240 dissimilarly from the operation of circuit 190 shown in FIG. 6. Furthermore, the selection of a particular segmented dummy region does not preclude the selection of the other segment of the opposing dummy region. That is, the evaluation scheme can assign a single user RSE, or multiple RSE, to the primary segment 230 of the first dummy region 226 while assigning another user RSE to the secondary segment 236 of the second dummy region 228.

Figure 10:
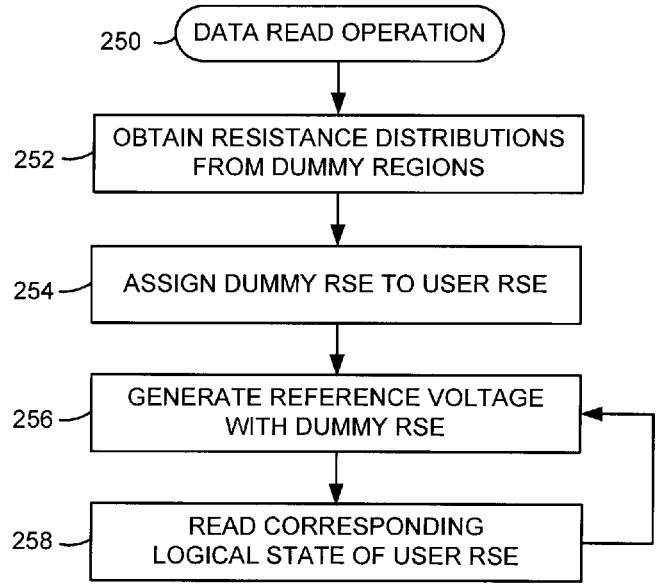
FIG. 10 displays a flow chart of a data read operation carried out in accordance with various embodiments of the present invention.

FIG. 10 displays a flow diagram of a data read operation 250 conducted in accordance with various embodiments of the present invention. In step 252, resistance distributions are obtained from the dummy regions. The distributions can be acquired and evaluated individually or simultaneously by an evaluation scheme to determine the best match between a user RSE and a dummy RSE. The result of obtaining the resistance distributions and evaluation scheme is the selection of the best dummy region, and corresponding dummy RSE in step 254.

The selection of the best dummy region facilitates the assigning of a user RSE to a dummy RSE so that the dummy RSE will provide reference values to reliably access the logical state of the corresponding user RSE in step 256. In step 258, the logical state of the user RSE is read and outputted by comparing the resistive state of the user RSE to the reference value generated by the selected dummy RSE. The read operation 250 can continue to read, or reread, various user RSE by repeating steps 256 and 258 or the operation 250 can terminate.

In each of the foregoing embodiments, the resistance $R_A$ is substantially fixed. It will be appreciated, however, that the resistance $R_A$ can alternatively be made to be selectively programmable, such as through the use of one or more elements that are arrayed and configured to provide the desired resistance for the dummy reference cell. This can further be useful in adaptively adjusting a desired $V_{REF}$ level, and can compensate for other effects such as temperature, aging, etc. Moreover, while the respective switching device, MTJ and dummy resistor have been shown to be serially connected in each modified dummy cell, such is merely exemplary and not limiting, in that other arrangements can be readily used including but not limited to placement of the transistor in parallel with the MTJ and the dummy resistor.

The various embodiments presented herein have generally contemplated the storage of a single user data bit in each user memory cell in relation to whether the storage state of the associated resistive sense element (RSE), such as the MTJs of FIGS. 7 and 8, is relatively high or relatively low. Multiple bits, however, can be alternatively stored in each memory cell. For example, two bits can be stored if four resistive states can be established for the RSE element; that is, if separate resistances from low to high can be expressed as $R_1$, $R_2$, $R_3$ and $R_4$, then a two bit logical value "00" can be assigned to $R_1$, "01" assigned to $R_2$, "10" assigned to $R_3$ and "11" assigned to $R_4$. More generally, $2^N$ resistances can be used to store N bits of data in the memory cell.

In the foregoing example, three reference voltages of different magnitudes can be used to discern the respective programmed resistance of the memory cell. For example, a first $VREF_1$ can be used to sense whether the resistance of the memory cell is between $R_1$ and $R_2$; a second $VREF_2$ can be set to sense whether the resistance of the memory cell is between $R_2$ and $R_3$; and a third $VREF_3$ can be used to sense whether the resistance of the memory cell is between $R_3$ and $R_4$.

In such case, it will be appreciated that the respective reference voltages $VREF_1$, $VREF_2$ and $VREF_3$ generally need to be relatively precise to ensure correct reading takes place of the resistive state of the memory cell. In some embodiments, three different dummy reference cells are used with different $R_A$ values to generate the respective $VREF_1$, $VREF_2$ and $VREF_3$ reference voltages.

It will now be appreciated that the various embodiments presented herein provide various advantages over the prior art. The use of a dummy resistance in a dummy RSE can result in significant reductions in variations in the reference voltage generated by the dummy cell.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
obtaining a first resistance distribution for a first dummy region of resistance sense elements (RSEs) and a second resistance distribution for a second dummy region of RSEs; and
assigning a user RSE from a user region to a selected RSE of one of the first or second dummy regions in relation to the first and second resistance distributions, the assigning of the user RSE determined by the resistance distribution of the dummy region that best complies with a predetermined resistance tolerance range.

2. The method of claim 1, wherein the assigning step occurs only during manufacturing.

3. The method of claim 1, further comprising the step of generating a reference voltage from a plurality of resistance values of a dummy RSE of the second reference region by passing a current through a matched dummy RSE, wherein a magnitude of the reference voltage is set in relation to the selected resistive state of the user RSE and the resistance of the dummy RSE.

4. The method of claim 1, wherein the logical location of the user RSE in a memory space is between the first and second dummy regions.

5. The method of claim 1, wherein the dummy regions are segmented into a primary group of dummy RSEs and a secondary group of dummy RSEs, to which a first portion of the user RSE is assigned to the primary group of dummy RSE of the first dummy region and a second portion of user RSE is assigned to the secondary group of dummy RSE of the second dummy region.

6. The method of claim 1, wherein the assigning step further comprises storing a matched orientation of the logical addresses of the assigned user RSE and dummy RSE in a memory space.

7. The method of claim 6, wherein the assigned logical addresses of the user RSE and dummy RSE is stored in a resistive random access memory (RRAM) cell.

8. The method of claim 6, wherein the matched logical addresses of the user RSE and dummy RSE is stored in a spin torque transfer random access memory (STRAM) cell.

9. The method of claim 6, wherein the matched orientation is utilized only during a read operation conducted on the user RSE.

10. A method comprising:
obtaining a first resistance distribution for a first dummy region of resistance sense elements (RSEs) and a second resistance distribution for the second dummy region of RSEs, wherein the dummy regions are segmented into a primary group of dummy RSEs and a secondary group of dummy RSEs; and
assigning a first portion of a user region of RSEs to the primary group of dummy RSE of the first dummy region and a second portion of the user region to the secondary group of dummy RSE of the second dummy region in relation to the first and second resistance distributions.

11. The method of claim 10, wherein the user RSE are assigned before any user data is written to the user region.

12. The method of claim 10, further comprising the step of generating a reference voltage from a plurality of resistance values of a dummy RSE of the second reference region by passing a current through a matched dummy RSE, wherein a magnitude of the reference voltage is set in relation to the selected resistive state of the user RSE and the resistance of the dummy RSE.

13. The method of claim 10, wherein a matched orientation of the logical locations of the matched user RSE and dummy RSE is stored in a memory space.

14. The method of clam 10, wherein the first dummy region is located at a logical address on a memory space that ultimately opposes the logical address of the second dummy region.

15. An apparatus comprising a first resistance distribution obtained from a first dummy region of resistance sense elements (RSEs) and a second resistance distribution obtained from a second dummy region of RSEs, and a user region having a user RSE that is assigned to a selected RSE of one of the first or second dummy regions in relation to the first and second resistance distributions, wherein a reference voltage is generated from a plurality of resistance values of a dummy RSE of the second reference region bypassing a current through a matched dummy RSE, and wherein a magnitude of the reference voltage is set in relation to the selected resistive state of the user RSE and the resistance of the dummy RSE.

16. The apparatus of claim 15, wherein a matched orientation of the logical addresses of the assigned user RSE and dummy RSE is stored in a memory space.

17. The apparatus of claim 16, wherein the matched logical addresses of the user RSE and dummy RSE is stored in a resistive random access memory (RRAM) cell.

18. The method of claim 16, wherein the matched logical addresses of the user RSE and dummy RSE is stored in a spin torque transfer random access memory (STRAM) cell.

* * * * *